US005508889A

United States Patent [19]

Ii

[11] Patent Number: 5,508,889

[45] Date of Patent: Apr. 16, 1996

[54] SHIELD COVER AND SHIELDING METHOD USING THE SAME

[75] Inventor: Hidehiro Ii, Koube, Japan

[73] Assignee: Molex Incorporated, Lisle, Ill.

[21] Appl. No.: 449,033

[22] Filed: May 24, 1995

[30] Foreign Application Priority Data

Jul. 29, 1994 [JP] Japan .................................... 6-170108

[51] Int. Cl.$^{6}$ ....................................................... H05K 9/00

[52] U.S. Cl. .......................... 361/816; 361/796; 361/801; 361/818; 174/35 R; 439/108

[58] Field of Search .................................... 361/752, 759, 361/796, 800, 798, 801, 802, 816, 818; 257/659, 660; 174/35 R; 439/108, 109, 65, 79, 567, 570; 220/400

[56] References Cited

U.S. PATENT DOCUMENTS 5,053,924 10/1991 Kurgan .................................... 361/424
5,053,926 10/1991 Dickie ..................................... 361/424
5,096,440 3/1992 Katsumata .............................. 439/570
5,137,472 8/1992 Hillbish et al. .......................... 439/607
5,192,228 3/1993 Collins et al. .......................... 439/567
5,239,127 8/1993 Swikle et al. ............................ 174/35
5,281,169 1/1994 Kiat et al. ............................... 439/607

FOREIGN PATENT DOCUMENTS 4-78190 3/1992 Japan .

*Primary Examiner*—Leo P. Picard
*Assistant Examiner*—Y. Whang
*Attorney, Agent, or Firm*—Stephen Z. Weiss

[57] ABSTRACT

Disclosed is an improved shield enclosure comprising a open box-like body having flexible locking arms and flexible grounding arms both integrally connected to the lower edge of the open box-like body. The shield enclosure can be fixed to a printed circuit board, and be grounded simply by inserting its flexible locking arms in the fastening apertures of the printed circuit board, and be grounded by the flexible grounding arms being forced into contact with a ground strip on the printed circuit board, thus requiring no soldering and accordingly improving the efficiency with which shield enclosures can be attached to printed circuit boards.

5 Claims, 2 Drawing Sheets

SHIELD COVER AND SHIELDING METHOD USING THE SAME

FIELD OF THE INVENTION

The present invention relates to a shield cover to be used for shielding selected electric and/or electronic parts on a printed circuit board, thereby shielding such selected electric or electronic parts from electromagnetic waves or static electricity induced from the surrounding electric or electronic parts and devices, or preventing radiation of electromagnetic waves from such selected electric or electronic parts on the printed circuit board to the surrounding electric or electronic parts and devices.

BACKGROUND OF THE INVENTION

As is well known, selected electric or electronic parts on a printed circuit board radiate electromagnetic wave to cause noise or unwanted signals to appear in adjacent parts on the printed circuit board or electric or electronic parts and devices existing in the vicinity of the printed circuit board. In an attempt to prevent such electromagnetic radiation, an open box-like metal shield cover is mounted to a printed circuit board to enclose selected electric or electronic parts which otherwise, would be a cause for interference trouble.

A conventional metal shield cover is mounted to a printed circuit board by using fasteners appropriate for the purpose. Thereafter, the metal shield is soldered to selected grounding strips on the printed circuit board at selected locations of its side walls.

Using solder to mechanically hold and electrically connect the metal shield to the printed circuit board is a time-consuming and tedious job. This also requires the use of extra space on the printed circuit board while there is little or no extra space available. When space is not available soldering is almost or quite impossible.

SUMMARY OF THE INVENTION

One object of the present invention is to provide a shield cover which requires no soldering to mechanically hold and electrically ground the shield cover to a printed circuit board.

Another object of the present invention is to provide a shield cover which is mounted easily and efficiently with less labor expense.

To attain these and other objects an electromagnetic shield is provided for at least one electronic component mounted on a printed circuit board. The shield includes an enclosure, flexible locking arms and flexible grounding arms. The enclosure has an open end, side walls, and a top wall opposite the open end. Edges of the side walls opposite the top wall define the open end. The enclosure is at least partially formed from an electrically conductive, electromagnetic wave absorbing material.

The flexible locking arms are integrally formed with the enclosure, extend below the side wall edges defining the open end, and have a locking nib adapted to first contact an aperture in the printed circuit board causing the flexible arm to slightly bend. After the nib passes completely through the aperture, the nib will snap under the printed circuit board allowing the flexible locking arm to resume its unbent position and lock the shield to the printed circuit board.

The flexible ground arms are integrally formed from a side wall and have a contact portion adapted to be forced into contact with a ground trace on the printed circuit board to electrically connect the enclosure to ground. The contact portion of the arm is formed at an edge of the arm generally in line with the side wall edge and moveable generally in a plane of the side wall. The shield is thereby held to the printed circuit board and connected to a ground strip without the use of separate fasteners or solder.

In a first embodiment of the invention a slot is provided in a side wall generally parallel to a side wall edge and with one slot end continuing through a side wall edge and adapted to make the grounding arm more flexible. In a second embodiment of the invention two slots are provided in the side wall perpendicular to a side wall edge and continuing through a portion of the top wall. These two slots define the grounding arm and make the grounding arm more flexible.

BRIEF DESCRIPTION OF THE DRAWINGS

Other objects and advantages of the present invention will be understood from the following description of shield covers according to preferred embodiments of the present invention, which are shown in accompanying drawings.

DETAILED DESCRIPTION OF THE PREFERRED EMBODIMENTS

Figure 1:
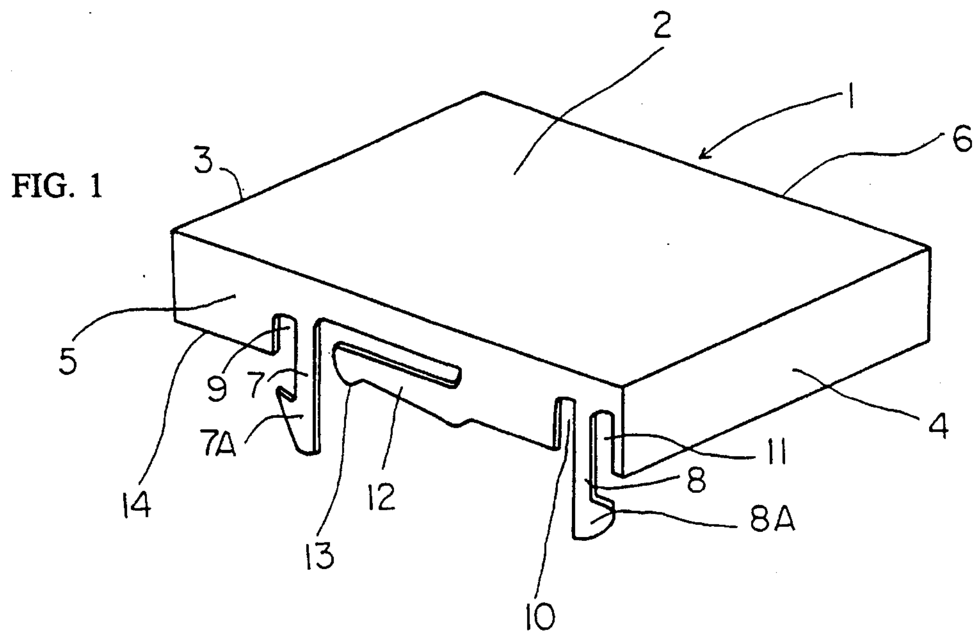
FIG. 1 is a perspective view of a shield cover according to a first embodiment of the present invention.
Figure 2:
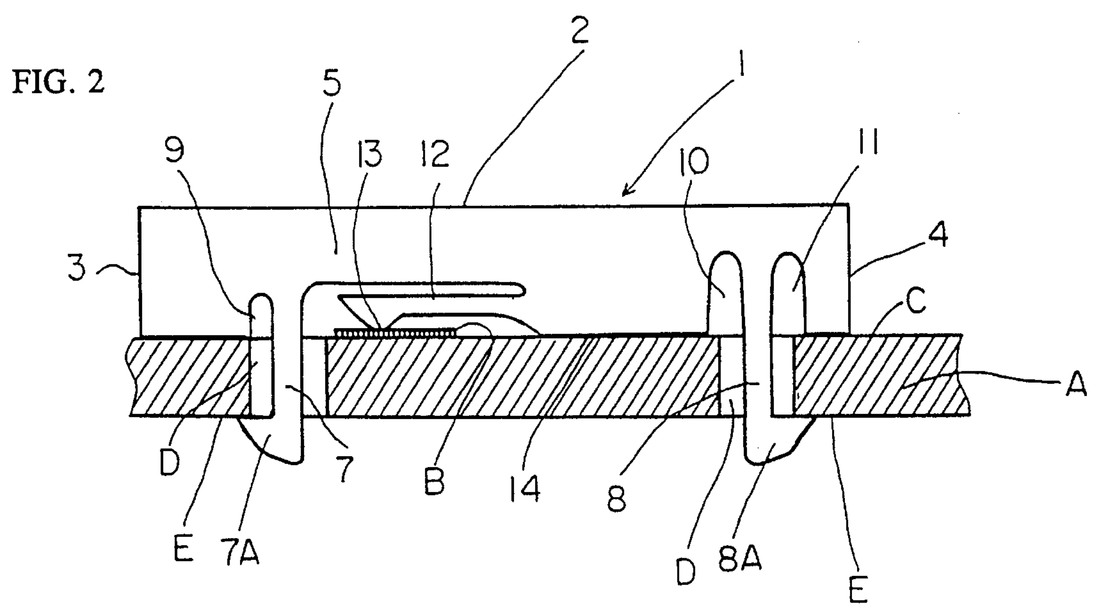
FIG. 2 shows the shield cover of the first embodiment attached to a printed circuit board, which is shown in section.

Referring to FIGS. 1 and 2, a shield cover 1 according to the first embodiment of the present invention is made of a 0.2 mm thick metal sheet by bending or drawing it into an open ended enclosure having a top wall 2, opposite side walls 3, 4 and front and rear walls 5 and 6. The front wall 5 has two flexible locking arms 7 and 8 integrally connected thereto. These flexible locking arms 7 and 8 extend beyond the lower edge 14 of the front wall. Specifically, the flexible locking arms 7 and 8 are long enough to permit their nibs 7A and 8A to be caught by the lower or rear surface E of a printed circuit board A when the open ended enclosure 1 of the shield is mounted on the upper surface C of the printed circuit board A with its flexible locking arms 7 and 8 inserted in the fastening apertures D of the printed circuit board A. As seen from FIG. 1, the front wall has vertical slots 9, 10 and 11 made adjacent to the flexible locking arms 7 and 8. These vertical slots 9, 10 and 11 facilitate the insertion and removal of the flexible locking arms 7 and 8 from the fastening apertures D of the printed circuit board A. The front wall 5 has a flexible grounding arm 12 stamped integrally therefrom and extending laterally between its flexible locking arms 7 and 8. The flexible grounding arm 12 has a contact 13 formed in the edge of the arm at its end. The flexible grounding arm 12 is so positioned that its grounding contact 13 may be put in contact with a grounding strip B on the printed circuit board A. To hold the enclosure 1 to the printed circuit board A, the shield enclosure 1 is attached to the printed circuit board A when the flexible locking arms 7 and 8 are fully inserted into fastening apertures D of the printed circuit board A until their nibs 7A and 8A are caught by the lower, rear surface of the printed circuit board A. Preferably the flexible grounding arm 12 is yieldingly bent a bit to force its contact 13 into the grounding strip B on the printed circuit board A with an appreciable quantity of pressure. The rear wall 6 has similar flexible grounding arm integrally connected thereto.

In use, the shield enclosure is placed on the printed circuit board A to enclose selected electric or electronic parts by inserting its flexible locking arms 7 and 8 in the fastening apertures D of the printed circuit board A. The shafts of the flexible locking arms 7 and 8 will bend due to the outer angled position of the nibs 7A and 8A contacting the inner wall of apertures D. After being fully inserted through the apertures, the nibs 7A and 8A will snap back to their original position as a result of flexible locking arms 7 and 8 flexing back to their original unbent positions. In this position the nibs 7A and 8A are caught by the lower, rear surface E of the printed circuit board A holding the enclosure in position to the board while contact 13 is forced into contact with the grounding strip B with an appropriate pressure. This will insure that a good electrical connection is made between the shield enclosure 1 and the grounding strip B of the printed circuit board A. Thus, no soldering is required in attaching the shield enclosure 1 to the printed circuit board A and in grounding the shield enclosure. Accordingly the shield enclosure can be attached to the printed circuit board quickly, easily and without the use of separate fasteners or solder. No electromagnetic wave can be radiated from the shielded electric or electronic parts, and the shielded electric or electronic parts are not exposed to surrounding electromagnetic waves. Static electricity appearing on the shield enclosure will also be depleted to the ground.

Figure 3:
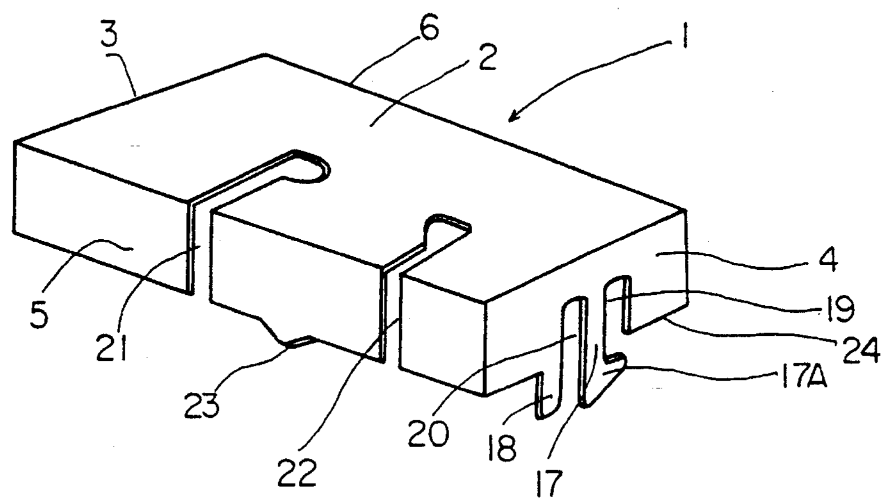
FIG. 3 is a perspective view of a shield cover according to a second embodiment of the present invention.
Figure 4:
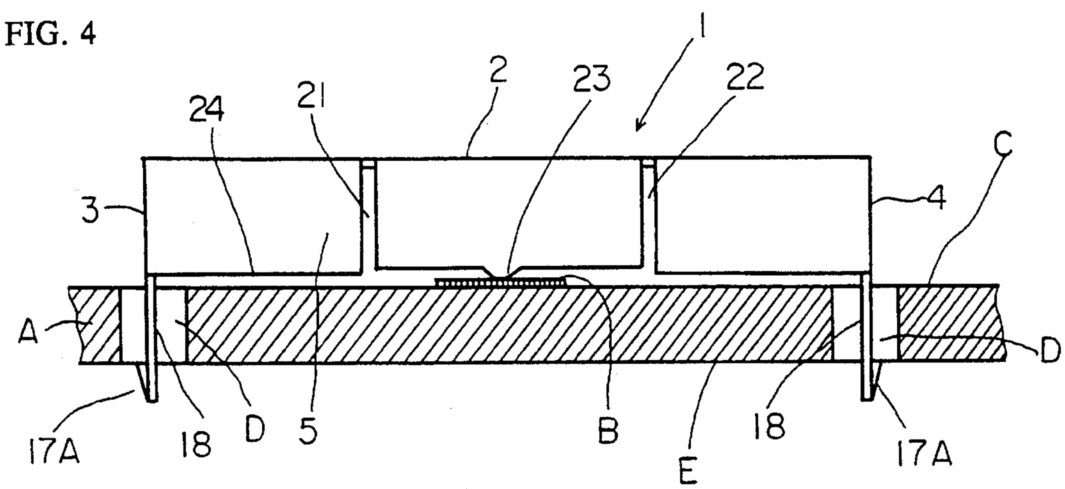
FIG. 4 shows the shield cover of the second embodiment attached to a printed circuit board, which is shown in section.

FIGS. 3 and 4 show a shield enclosure 1 according to the second embodiment of the present invention. In these drawings the same parts as shown in FIGS. 1 and 2 are indicated by the same reference numerals as used in FIGS. 1 and 2, and explanations are omitted.

Flexible locking arm 17 and backup arm 18 are integrally connected to the right wall 4. These arms 17 and 18 work together to provide the fastening function. The left wall 3 has similar fastening arms integrally stamped therefrom. The flexible locking arm 17 and backup arm 18 are inserted in a single fastening aperture D until the nib 17A of the flexible locking arm 17 is caught by the lower or rear surface E of the printed circuit board A. Similar to the first embodiment, vertical slots 19 and 20 are made on either side of the flexible locking arm 17 making it more flexible. The flexible locking arm 17 extends beyond the lower edge 24 of the right and left side walls 3 and 4.

A flexible grounding arm 23 is integrally stamped from the front wall 5 and part of the top wall 2. Two vertical slots 21 and 22 are formed on either side of the grounding arm 23 to define a slotted bending section. It will yieldingly bend up when the edge of the grounding contact 25 is forced against the grounding strip B on the printed circuit board A.

FIG. 4 is a side view of the second embodiment in FIG. 3 showing the shield enclosure 1 fixed to the printed circuit board A to enclose selected electric or electronic parts thereon by inserting its flexible locking arm 17 and backup arm 18 in the fastening apertures D until the nib 17A of the flexible locking arm 17 is caught under the rear surface of the printed circuit board A. Then, the grounding contact 25 is forced against the grounding strip B of the printed circuit board A. The size of the flexible grounding arm 23 is so determined that the slotted flexible grounding arm may be resiliently raised and bent when the grounding contact 25 is forced against the grounding strip B, thereby assuring that the grounding contact 25 is pushed against the grounding strip B with pressure strong enough to make a good electric connection therebetween. No soldering is required in attaching the shield enclosure 1.

In each of these embodiments the shield enclosure is described as being stamped from sheet metal. However the enclosure can be made of a plastic mold having an electronically conductive coating thereon, such as plating. In this arrangement the grounding contacts 13 and 25 must have a layer of electrically conductive electromagnetic absorbing material thereon to abut against the grounding strip B of the printed circuit board A.

As may be understood from the above, a shield enclosure according to the present invention can be fixed to a printed circuit board, and be grounded simply by inserting its fastening pieces in the fastening apertures of the printed circuit board, thus requiring no soldering and improving the efficiency with which shield enclosure can be attached to printed circuit boards.

I claim:

1. An electromagnetic shield for at least one electronic component mounted on a printed circuit board comprising:

an enclosure having an open end, side walls, and a top wall opposite the open end, edges of the side walls opposite the top wall defining the open end, the enclosure at least partially formed from an electrically conductive, electromagnetic wave absorbing material;

flexible locking arms integrally formed with the enclosure extending below and perpendicular to the side wall edges, said flexible locking arms having a locking nib adapted to first contact an aperture in said printed circuit board causing said flexible locking arm to slightly bend and then to snap under said printed circuit board when said nib completely passes through said aperture allowing the flexible locking arm to return to an unbent position, and flexible ground arms integrally formed from a side wall having a contact portion adapted to be forced into contact with a ground strip on the printed circuit board to electrically connect the enclosure to ground, the contact portion of said arm formed at an edge of the arm generally in line with the side wall edge and moveable generally in a plane of the side wall, whereby the electromagnetic shield is held to the printed circuit board and electrically connected to a ground strip without the use of separate fasteners and solder.

2. An electromagnetic shield as in claim 1 wherein a slot is provided in a side wall generally parallel to a side wall edge and with one slot end continuing through a side wall edge and adapted to make the grounding arm more flexible.

3. An electromagnetic shield as in claim 1 wherein two slots are provided in said side wall perpendicular to a side wall edge and continuing through a portion of the top wall, said slots defining the grounding arm and adapted to make the grounding arm more flexible.

4. An electromagnetic shield as in claim 2 wherein said wave absorbing material is sheet metal.

5. An electromagnetic shield as in claim 3 wherein said wave absorbing material is sheet metal.

* * * * *